(12) United States Patent
Uzuka et al.

(10) Patent No.: US 7,573,718 B2
(45) Date of Patent: Aug. 11, 2009

(54) SPACER, PRINTED CIRCUIT BOARD, AND ELECTRONIC EQUIPMENT

(75) Inventors: Yoshinori Uzuka, Kawasaki (JP);
Masahiro Suzuki, Kawasaki (JP);
Takeshi Nishiyama, Kawasaki (JP);
Masaki Yoshimaru, Kawasaki (JP);
Hirotoshi Muraishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/849,523

(22) Filed: May 20, 2004

(65) Prior Publication Data

US 2005/0167153 A1 Aug. 4, 2005

(30) Foreign Application Priority Data

Jan. 29, 2004 (JP) ............................. 2004-020999

(51) Int. Cl.
*H05K 7/12* (2006.01)
(52) U.S. Cl. ................... 361/742; 174/138 G; 361/758; 257/710
(58) Field of Classification Search ............. 174/138 G, 174/166 S, 137 R, 138 R, 138 E; 361/742, 361/758, 770, 804; 257/710, 696
See application file for complete search history.

(56) References Cited

U.S. PATENT DOCUMENTS

| | | | | |
|---|---|---|---|---|
| 4,480,289 A | * | 10/1984 | Huffman | 361/767 |
| 4,595,794 A | * | 6/1986 | Wasserman | 174/138 G |
| 4,894,706 A | * | 1/1990 | Sato et al. | 361/770 |
| 5,381,316 A | * | 1/1995 | Hirai | 361/760 |
| 5,528,462 A | * | 6/1996 | Pendse | 361/767 |
| 5,648,890 A | * | 7/1997 | Loo et al. | 361/770 |
| 5,677,246 A | * | 10/1997 | Maeta et al. | 438/118 |
| 5,684,677 A | * | 11/1997 | Uchida et al. | 361/770 |
| 5,745,985 A | * | 5/1998 | Ghosh et al. | 29/834 |
| 5,764,498 A | * | 6/1998 | Sundstrom | 361/809 |
| 5,895,970 A | * | 4/1999 | Miyoshi | 257/696 |
| 5,926,371 A | * | 7/1999 | Dolbear | 361/704 |
| 6,020,809 A | * | 2/2000 | Miyazaki et al. | 338/22 R |
| 6,088,915 A | * | 7/2000 | Turturro | 29/840 |
| 6,493,240 B2 | * | 12/2002 | Broglia et al. | 361/803 |
| 6,614,108 B1 | * | 9/2003 | Sanftleben et al. | 257/710 |

(Continued)

FOREIGN PATENT DOCUMENTS

JP 6-23276 3/1994

(Continued)

OTHER PUBLICATIONS

Japanese Office Action for corresponding Japanese Patent Application No. 2004-020999 dated Aug. 5, 2008 (2 pgs).

*Primary Examiner*—Dhiru R Patel
(74) *Attorney, Agent, or Firm*—Staas & Halsey LLP

(57) ABSTRACT

The spacer is formed as an elastic member with no ends thereof, which is detachably attached, by exploiting its elastic deformation, onto a printed wiring board to which is fixed an electronic component having a component package, on one of whose surfaces connection terminals are arranged. Since the spacer is attached on the printed wiring board to enclose an electronic component so as to seal a gap formed between the electronic component and a printed wiring board, it is possible to prevent foreign objects entering the gap, so that failures, such as insufficient insulation, caused by such foreign objects are also prevented. Since the spacer is easily removed from the printed wiring board, it is recyclable and economical.

10 Claims, 15 Drawing Sheets

U.S. PATENT DOCUMENTS 7,119,430 B2 * 10/2006 Tsuchiyama ................ 257/696

FOREIGN PATENT DOCUMENTS

| JP | 11-163043 | 6/1999 |
| JP | 11-177204 | 7/1999 |
| JP | 11-266075 | 9/1999 |
| JP | 2000-31320 | 1/2000 |
| JP | 2001-60842 | 3/2001 |
| JP | 2002-195410 | 7/2002 |

* cited by examiner

54: UNDERSURFACE
53: PACKAGE TERMINAL
50: IC PACKAGE (ELECTRONIC COMPONENT)

SPACER, PRINTED CIRCUIT BOARD, AND ELECTRONIC EQUIPMENT

BACKGROUND OF THE INVENTION

1. Field of the Invention:

The present invention relates to a spacer suitable for use in attaching a packaged electronic component, such as an IC (Integrated Circuit) chip, onto a printed wiring board which has electronic circuits mounted thereon. The invention also relates to a printed circuit board that includes such a spacer mounted thereon and to electronic equipment including such a printed circuit board.

2. Description of the Related Art:

Japanese Patent Application Laid-open No. HEI 6-23276 (Patent Document 1), for example, discloses an IC package mounting structure which includes an insulating spacer, interposed between an IC package (circuit element) and a printed wiring board (circuit board), to conceal electrode pins exposed in a gap formed between the IC package and the circuit board so as to prevent dust or metal debris entering and accumulating in the gap, which can cause insulation faults and operation faults.

Conductive materials, such as metal debris, entering the gap between the IC package and the circuit board can cause a short circuit and subsequent disfunction of the IC package. In particular, such a short circuit occurring between electrode pins can even cause burnout. Further, nonconductive objects can also cause insulation faults if they enter the gap and are combined with moisture.

According to the technique of Patent Document 1, a spacer is attached to the circuit board before an IC package is mounted thereon, thereby preventing foreign objects entering the gap between the IC package and the circuit board.

[Patent Document 1] Japanese Patent Application Laid-open No. HEI 6-23276

However, when such a previous IC package mounting technique is applied to a BGA (Ball Grid Array), where IC packages are soldered onto a printed wiring board, the following problems are encountered:

(1) Since the spacer is required to be made from a material resistant to heat from soldering, the manufacturing cost of the spacer is increased;

In particular, from an environmental point of view, lead-free solder has recently become more and more common. Since such lead-free solder, in comparison with lead-containing solder, requires a high temperature for soldering, spacers need to be made from material with high heat-resistance.

(2) If a need arises to remove IC packages from the printed wiring board for any reason, the spacers attached thereto interfere with detachment of the IC packages.

For instance, during a process of blowing hot air to melt solder to separate an IC package from a wiring board, a spacer arranged therebetween obstructs the hot air sent to terminals between the IC package and the board, thereby making it difficult to detach the IC package from the wiring board.

In addition, if the material of the spacer is not resistant to heat from the hot air, the spacer can be welded to the printed wiring board or the IC package, thereby interfering with the detachment of the IC package.

(3) After attaching IC packages to a printed wiring board, if the board needs to be washed, the spacers make it difficult for cleaning fluid to reach soldered portions, thereby causing insufficient washing. On the other hand, once the cleaning fluid reaches the soldered portions, the spacer makes exit of the cleaning fluid difficult. That is, the spacer decreases the efficiency of washing the printed wiring board.

(4) From the viewpoint of efficient use of resources, such spacers are preferably recycled. At recycling, it is necessary to remove solder debris or flux adhered to the spacers at attachment or detachment of IC packages. Such removal requires complicated processes, which makes recycling of spacers difficult and increases costs.

SUMMARY OF THE INVENTION

With the foregoing problems in view, it is one object of the present invention to provide a spacer which prevents foreign objects entering a gap formed between an electronic component and a printed wiring board, and which makes it easy to detach the electronic component having been fixed to the wiring board, and also which can be recycled with ease, thereby improving its cost performance. Another object of the invention is to provide a printed circuit board including such a spacer attached on a printed wiring board. In addition, a further object of the invention is to provide electronic equipment including such a printed circuit board.

In order to accomplish the above object, according to the present invention, there is provided a spacer for attaching onto a printed wiring board on which fixed is an electronic component having a component package, on one of whose surfaces a connection terminal is arranged. The spacer comprises an elastic member with no ends thereof, and the elastic member is adapted to be detachably attached onto the printed wiring board in such a way as to enclose the electronic component to seal a gap between the electronic component and the printed wiring board, and the elastic member is also adapted to be attached onto and detached from the printed wiring board by exploiting elastic deformation of the elastic member.

As a preferred feature, the elastic member has a frame-like shape with an inner outline which is similar in figure to the outline of the component package and is smaller in length than the outline of the component package. In addition, the inner outline portion of the elastic member is thinner than the gap between the electronic component and the printed wiring board.

As another preferred feature, the elastic member has a frame-like shape with an inner outline which is similar in figure and length to the outline of the component package, and the inner outline portion of the elastic member is thinner than the gap between the electronic component and the printed wiring board. In addition, the frame-like shape has a pair of hook portions, provided on the inner outline of the frame-like shape to oppose to each other, for projecting into the gap between the electronic component and the printed wiring board.

As still another feature, the frame-like shape has an outer outline greater in length than the outline of the component package, and has at least one slit thereon extending from the inner outline toward the outer outline of the frame-like shape.

As yet another feature, the frame-like shape has a round hole formed at one end of the slit, and the round hole functions as a jig hole for use in removing the spacer from the electronic component and the printed wiring board.

As a further preferred feature, the elastic member, while being in contact with the printed wiring board, is attached around the component package by pressure due to the elastic deformation of the elastic member.

As a still further preferred feature, the elastic member has a cross-sectional shape with a projecting portion thereof, which projects into the gap between the electric component and the printed wiring board when the elastic member is attached on the printed wiring board.

As a furthermore preferred feature, the elastic member has a frame-like shape with an inner outline similar in figure to the outline of the component package, and is attached around the component package by pressure due to the elastic deformation of the elastic member, and the frame-like shape has a catch protrusion on its inner outline, which catch protrusion is adapted to protrude into the gap between the electronic component and the printed wiring board.

As a generic feature, there is provided a printed circuit board, which comprises: an electronic component having a component package, on one of whose surfaces a connection terminal is arranged; a printed wiring board on which the electronic component is fixed; and a spacer formed as an elastic member with no ends thereof detachably attached onto the printed wiring board in such a way as to enclose the electronic component to seal a gap between the electronic component and the printed wiring board. The elastic member is adapted to be attached onto and detached from the printed wiring board by exploiting elastic deformation of the elastic member.

As a preferred feature, the elastic member has a frame-like shape with an inner outline which is similar in figure to the outline of the component package, and is smaller in length than the outline of the component package. The inner outline portion of the elastic member is thinner than the gap between the electronic component and the printed wiring board.

As another preferred feature, the elastic member, while being in contact with the printed wiring board, is attached around the component package by pressure due to the elastic deformation of the elastic member.

As still another preferred feature, the elastic member has a frame-like shape with an inner outline which is similar in figure to an outline of the component package, and is attached around the component package by pressure due to the elastic deformation of the elastic member, while it is being in contact with the printed wiring board. The frame-like shape has a catch protrusion on its inner outline, which catch protrusion is adapted to protrude into the gap between the electronic component and the printed wiring board.

As another generic feature, there is provided electronic equipment, comprising a printed circuit board which includes: an electronic component having a component package, on one of whose surfaces a connection terminal is arranged; a printed wiring board on which the electronic component is fixed; and a spacer formed as an elastic member with no ends thereof detachably attached onto the printed wiring board in such a way as to enclose the electronic component to seal a gap between the electronic component and the printed wiring board. The elastic member is adapted to be attached onto and detached from the printed wiring board by exploiting elastic deformation of the elastic member.

As a preferred feature, the elastic member has a frame-like shape with an inner outline which is similar in figure to the outline of the component package, and is smaller in length than the outline of the component package. The inner outline portion of the elastic member is thinner than the gap between the electronic component and the printed wiring board.

As another preferred feature, the elastic member, while being in contact with the printed wiring board, is attached around the component package by pressure due to the elastic deformation of the elastic member.

As still another preferred feature, the elastic member has a frame-like shape with an inner outline which is similar in figure to the outline of the component package, and is attached around the component package by pressure due to the elastic deformation of the elastic member, while it is being in contact with the printed wiring board. The frame-like shape has a catch protrusion on its inner outline, which catch protrusion is adapted to protrude into the gap between the electronic component and the printed wiring board.

The spacer, printed circuit board, and electronic equipment of the present invention guarantee the following advantageous results.

(1) Since the spacer is attached to the printed wiring board to enclose an electronic component so as to seal a gap formed between the electronic component and a printed wiring board, it is possible to prevent foreign objects entering the gap, so that failures, such as insufficient insulation, caused by such foreign objects are also prevented.

(2) The spacer is made of an elastic member with no ends thereof, and it is whereby possible to detachably attach the spacer onto a printed wiring board on which fixed is an electronic component, by exploiting elastic deformation of the spacer. As a result, when soldering an electronic component onto the printed wiring board, and also when removing the electronic component from the printed wiring board, the spacer can be separated therefrom in advance, so that the spacer needs not be manufactured from a material which is resistant to heat caused by soldering, thereby reducing the manufacturing cost of the spacer.

(3) Since the spacer is easily removed from the printed wiring board, it will never interfere with detachment of electronic components.

(4) Since the spacer is easily removed from the printed wiring board, it is recyclable and economical.

(5) Since the spacer is easily removed from the printed wiring board, it is easy to wash the printed wiring board.

(6) Partly since the elastic member, forming the body of the spacer, has a frame-like shape whose inner outline is similar in figure to and smaller in size than the outer shape of the electronic component package, and partly since the inner outline portion of the elastic member is formed thinner than the gap between the electronic component and the printed wiring board, it is possible to fit the spacer securely into the gap.

(7) Since the spacer has one or more slits formed thereon, extending from its inner outline toward its outer outline, it is possible to change the shape of the spacer with no difficulty when fixing it into the gap between the electronic component and the printed wiring board.

(8) Since round holes are formed at the ends of the slits, it is possible to prevent damages caused to the spacer by stress concentrated at the end portions. In addition, since these round holes also function as jig holes into which a removal jig is to be inserted to detach the spacer from the electronic component and the printed wiring board, it is possible to detach the spacer with ease from the printed wiring board, thereby increasing convenience.

(9) It is easy to attach and detach the spacer onto and from the printed wiring board.

(10) It is possible to mount the spacer in a secure manner on the printed wiring board.

Other objects and further features of the present invention will be apparent from the following detailed description when read in conjunction with the accompanying drawings.

DESCRIPTION OF THE PREFERRED EMBODIMENT(S)

Preferred embodiments of the present invention will be described hereinafter with reference to the relevant drawings.

(A) First Embodiment

Figure 1:
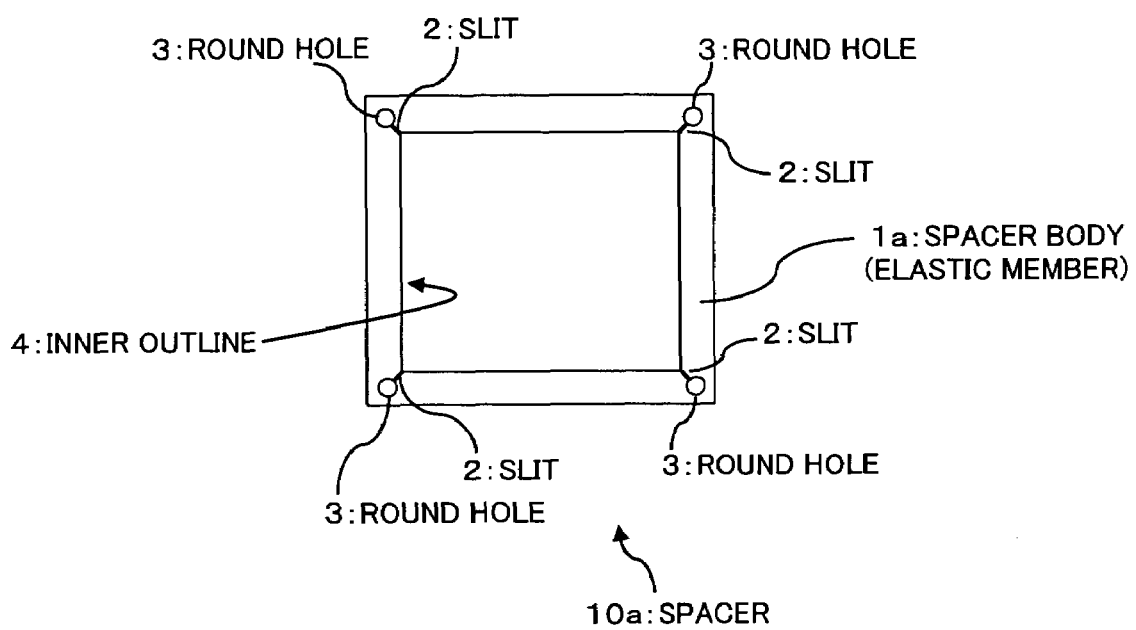
FIG. 1 is a block diagram schematically showing a construction of a spacer according to a first embodiment of the present invention.
Figure 2A:
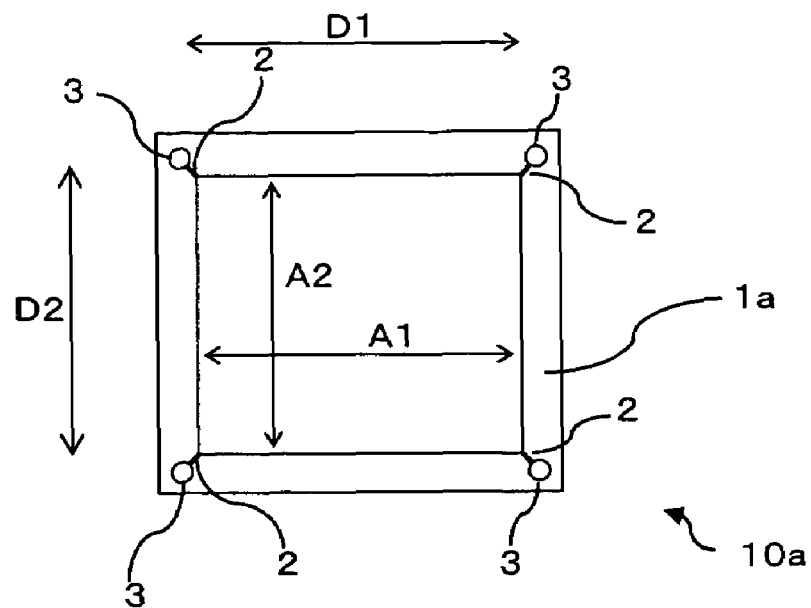
FIG. 2(*a*) illustrates the size of the spacer of the first embodiment of the present invention.
FIG. 2(b) illustrates the undersurface of the body of an IC package to which the spacer of FIG. 2(a) is attached.
Figure 2B:
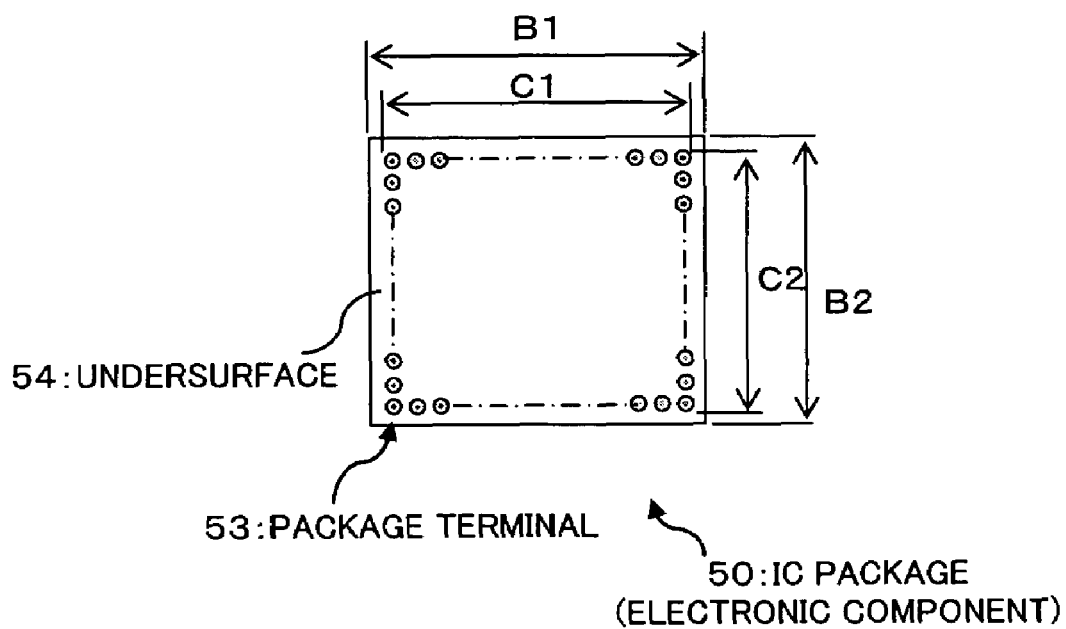
Figure 3A:
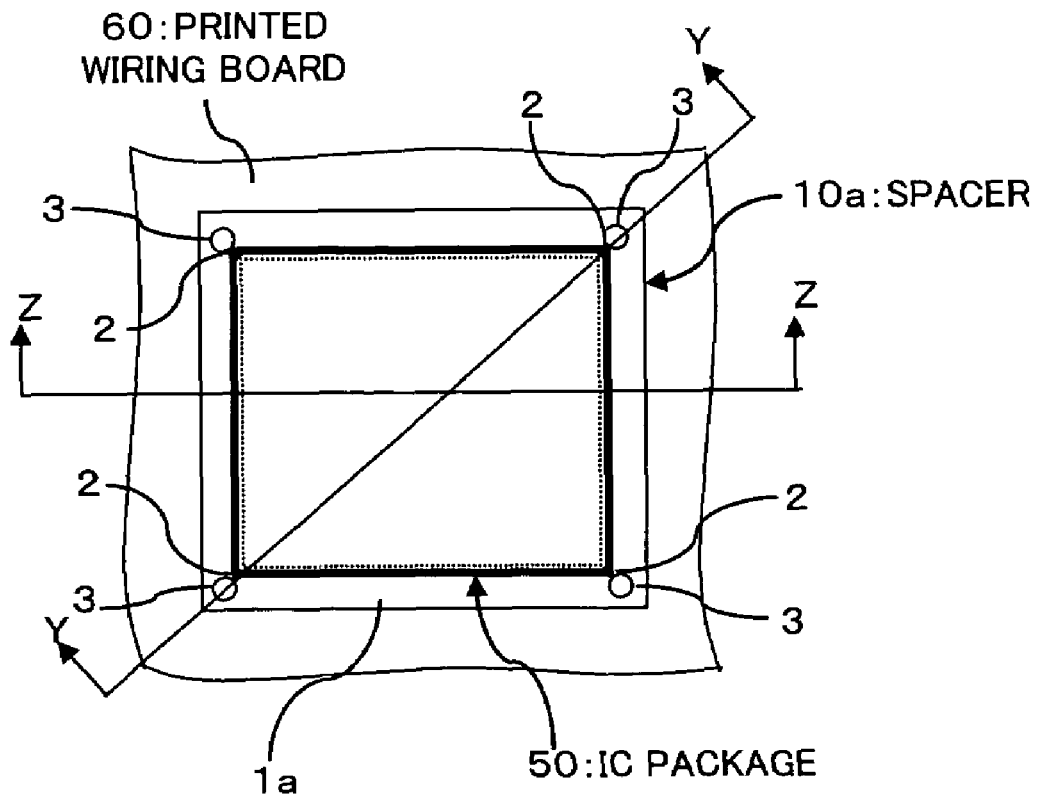
FIG. 3(a) and FIG. 3(b) are views illustrating the spacer of the first embodiment mounted on a printed wiring board.
Figure 3B:
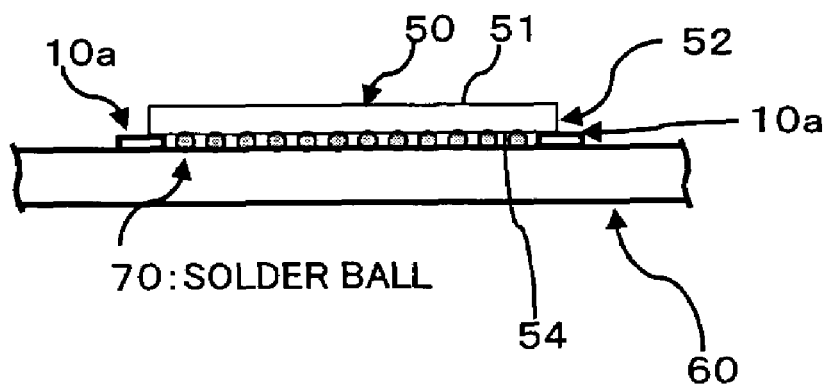

FIG. 1 depicts a spacer according to a first preferred embodiment of the present invention. FIG. 2(a) is a view illustrating the size of the spacer of the first embodiment and FIG. 2(b) illustrates the undersurface of the body of an IC package which the spacer of the first embodiment is attached to. Further, FIG. 3(a) and FIG. 3(b) are views for describing such a spacer of the first embodiment mounted on a printed wiring board; the former is a plan view, and the latter is the cross section Z-Z of the former.

A spacer 10a, which is to be attached to an IC package arranged on a printed wiring board that forms electronic equipment, has a spacer body 10a made of an elastic member with insulation. As shown in FIG. 1, the elastic member is formed into a frame-like shape (with no ends thereof) at the center of which is opened a window part 4, which is for fitting the elastic member around an IC package (electronic component) 50 (see FIG. 2(b)).

The outline of the window part 4, which forms the inner outline of a spacer body 1a, is similar in shape to the outer shape of the IC package 50 to which the spacer body 10a is to be attached. Here, in the present embodiment, since description is made of an example where the IC package 50 has a rectangular shape, the window part 4 is also given a rectangular shape.

The IC package 50, to which the spacer 10a is to be attached, is an electronic component with a rectangular package body (package) 51. On one surface (the undersurface, in FIG. 3(b)) 54 of the package body 51, there are arranged package terminals (connection terminals) 53 (see FIG. 2(b)) aligned along the edges of the undersurface.

These package terminals 53 are electrically connected to terminals (not illustrated) formed on a printed wiring board 60 (see FIG. 3(a) and FIG. 3(b)) via solder balls 70, one for each of the terminals. This produces a gap (hereinafter called the "gap between the IC package 50 and the printed wiring board 60) with a thickness equal to the diameter of each solder ball 70 between the undersurface 54, having package terminals 53 thereon, of the package body 51 and a surface of the printed wiring board 60, on which surface such non-illustrated terminals are arranged. The height of the gap between the IC package 50 and the printed wiring board 60 normally depends on the amount of solder and the type of solder paste (not illustrated) used in the solder balls 70.

Further, there are provided four slits 2, one for each of the four corners of the spacer body 1a, each of which slits 2 diagonally extends from the inner outline (window part 4) toward the outer outline of the spacer body 1a. In addition, on the spacer body 1a there are formed four round through holes 3, one for each slit 2. Each of the round holes 3 is arranged at one end, opposite the window part 4, of each individual slit 2.

As will be detailed later, when the spacer body 1a is attached to or detached from the IC package 50 and the printed wiring board 60 (see FIG. 3(b)) by exploiting elastic deformation of the spacer body 1a, the round hole 3 prevents damages being caused to the spacer body 1a by applied stress concentrated at such end portions of the slits 2. In addition, when removing the spacer 10a, the round holes 3 also function as jig holes, into which the tip of a removal jig 80 (FIG. 4(a) and FIG. 4(b); will be detailed later) is inserted to pick up the spacer body 1a, so that the spacer 10a can be easily detached from the printed wiring board 60.

Here, one or more slits 2 should be formed at different positions of the spacer body 1a. In the present example of the first embodiment, such slits 2 are formed at all the four corners of the spacer body 1a, and each of the slits 2 has a round hole 3 formed at its end.

The shape of the spacer 10a depends on the shape of the IC package 50 to which the spacer 10a is to be attached. As shown in FIG. 2(b), the spacer 10a satisfies conditions of A1<B1, A2<B2 and also those of A1>C1, A2>C2, where the size of the outer shape of the package body 51 of the IC package 50 is expressed as B1×B2 (horizontal×vertical); the size of an area with corners pointed by four package terminals 53 that are placed closest to the respective edges of the undersurface 54 of the package body 51, is given by C1×C2 (horizontal×vertical); and the size of the window part 4 of the spacer 10a is expressed as A1×A2 (horizontal×vertical).

Further, the spacer 10a is so formed as to satisfy conditions of A1>C1, A2>C2, where A1 and A2 are dimensions of the window part 4; C1 and C2 are dimensions between pairs of package terminals 53 that are arranged closest to the respective edges of the IC package 50. This arrangement can cause wobbling of the spacer 10a after its attachment around the IC package 50, and thus it is desirable to form the spacer 10a in such manner that the window part 4 of the spacer body 1a never becomes visible from underneath the IC package 50 (its outermost outline B1, B2) even with a maximum shift (wobbling) of the IC package 50.

That is, the following conditions of $$(B1-C1)/2 \geqq (A1-C1)/2, (B2-C2)/2 \geqq (A2-C2)/2$$

are preferred to be satisfied between differences A1-C1, A2-C2 and differences B1-C1, B2-C2, where A1-C1 and A2-C2 are differences between the dimensions A1, A2 of the window part 4 of the spacer 10a and the dimensions C1, C2 of the outermost outline of the area edged with the package terminals 53, respectively, and where B1-C1 and B2-C2 are differences between the dimensions B1, B2 of the external shape of the IC package 50 and the dimensions C1, C2 of the outermost outline of the area edged with the package terminals 53, respectively.

Here, the window part 4 is formed in such a manner that, even if the window part 4 of the spacer body 1a becomes visible from underneath the IC package 50 due to wobbling of the IC package 50, the visible part (gap) of the window part 4 remains smaller than probable foreign objects to be prevented from entering the gap.

In addition, the spacer body 1a is formed thinner than the gap formed between the IC package 50 and the printed wiring board 60, and the difference between the thickness of the spacer body 1a and the gap formed between the IC package 50 and the printed wiring board 60 is smaller than probable foreign objects to be prevented from entering the gap.

In other words, the spacer body 1a is formed to have dimensions such that the inner outline of its frame-like shape is smaller than the outer shape of the IC package 50 (package body 51), and such that the thickness at least of the inner outline portion of the spacer body 1a is smaller than the height of the gap formed between the IC package 50 and the printed wiring board 60.

Further, the distances, D1 and D2 (horizontal and vertical), between end portions of slits 2 adjacent to each other satisfy the following conditions of D1>B1, D2>B2, where the external size of the IC package 50 is B1×B2 (horizontal×vertical). In addition, if a removal jig 80 is used for detaching the spacer 10a, the round holes 3 are formed big enough to insert the tip of the removal jig 80 thereinto. Here, if no removal jig 80 is used for detachment of spacer 10a, the round holes 3 can be smaller.

The spacer body 1a is preferably made from an elastic material with insulation, for example, a polycarbonate resin sheet such as sunloid ecosheet POLICA (a registered trademark of Tsutsunaka Plastic Industry Co. Ltd.).

Referring now to FIG. 3(a) and FIG. 3(b), a description will be made hereinbelow how to attach such a spacer 10a of the first embodiment onto the printed wiring board 60 with the IC package 50 mounted thereon.

When the spacer 10a is attached onto the printed wiring board 60 on which an IC package 50 has been mounted, the spacer 10a is put on the printed wiring board 60 so as to enclose the package body 51 of the IC package 50, and is then pressed against the printed wiring board 60, while being deformed by exploiting its elasticity in such a way that the package body 51 sticks out of the window part 4. As a result, as shown in FIG. 3(a) and FIG. 3(b), the window part (inner outline) 4 of the spacer 10a is fitted into the gap between the IC package 50 and the printed wiring board 60 with no solder balls 70 arranged therein, so as to enclose the IC package 50 to seal the gap between the IC package 50 and the printed wiring board 60, thereby preventing foreign objects, such as metal debris, entering the gap.

Next, referring to FIG. 4(a) and FIG. 4(b), a description will be made hereinbelow how to remove the spacer 10a from the printed wiring board 60 on which the IC package 50 is mounted.

Figure 4A:
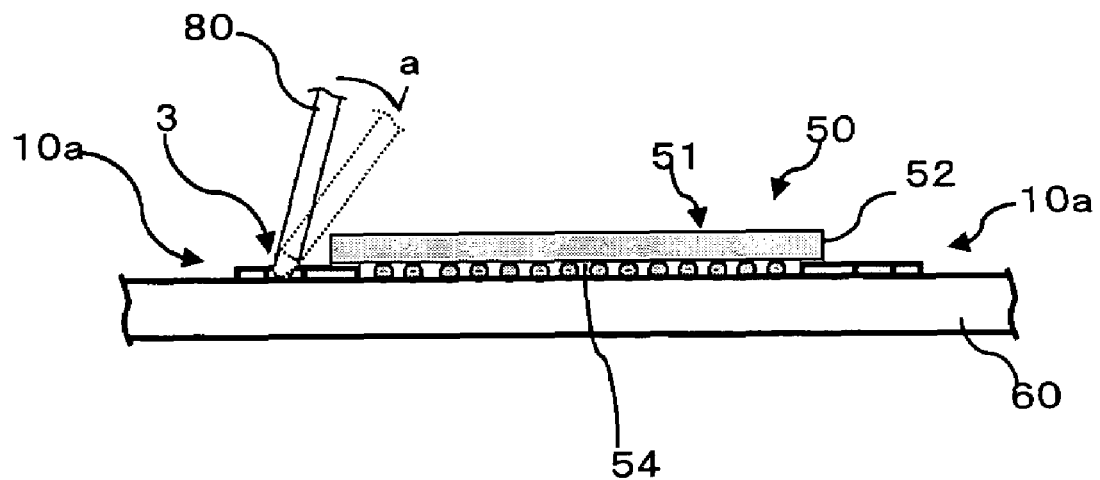
FIG. 4(a) and FIG. 4(b) are views for describing how to remove the spacer of the first embodiment from the printed wiring board.
Figure 4B:
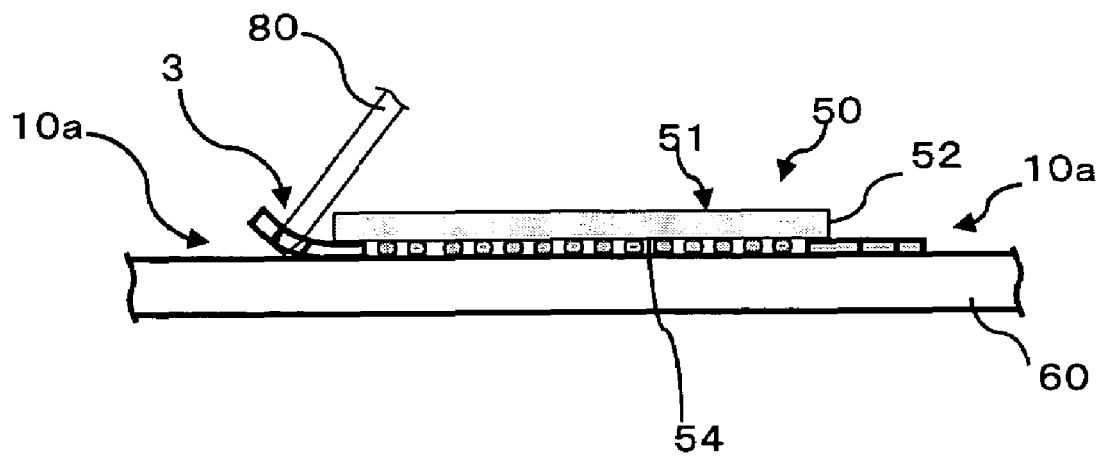

FIG. 4(a) and FIG. 4(b) are views for describing a way of detaching the spacer 10a of the first embodiment from the printed wiring board 60. FIG. 4(a) is the cross section Y-Y of FIG. 3(a) illustrating a removal jig 80 attached to the spacer 10a; FIG. 4(b) is also the cross section Y-Y of FIG. 3(a) illustrating a process of removal of the spacer 10a with the removal jig 80.

As shown in FIG. 4(a), a removal jig 80 is used to detach the spacer 10a from the printed wiring board 60 on which an IC package 50 is mounted. This removal jig 80 has a rod-like shape with a narrow enough point to be inserted into round holes 3 formed on the spacer 10a, and the point is preferred to have a spherical shape or to be so soft so as not to cause any damage to the printed wiring board 60. For instance, a toothpick or a bamboo stick can be used as such a removal jig 80.

When removing the spacer 10a from the printed wiring board 60 with the removal jig 80, the removal jig 80 is put into a round hole 3, as shown in FIG. 4(a), and pressed against the wall of the round hole 3 on the opposite side to the package body 51 in such a way that the tip of the removal jig 80 is inserted between the spacer 10a and the printed wiring board 60. After that, the removal jig 80 is tilted toward the package body 51 (in the direction indicated by arrow a in FIG. 4(a)) using leverage, thereby raising an edge of the spacer 10a, thus facilitating detachment of the spacer 10a.

In this manner, since the spacer 10a of the first embodiment is attached to the printed wiring board 60 in such a manner that it encloses the IC package 50 so as to seal the gap formed between the IC package 50 and the printed wiring board 60, it is possible to prevent foreign objects entering the gap, so that failures, such as insufficient insulation, caused by such foreign objects can also be prevented.

Further, the spacer 10a is made of an elastic member with a frame-like shape (with no ends thereof), thereby making it possible to detachably attach the spacer 10a onto the printed wiring board 60 on which is fixed an IC package 50, by exploiting elastic deformation of the spacer 10a. Inconsequence, when soldering the IC package 50 onto the printed wiring board 60, and also when removing the IC package 50 from the printed wiring board 60, the spacer 10a can be separated therefrom in advance, so that the spacer 10a need not be manufactured from a material which is resistant to heat caused by soldering, thereby reducing the manufacturing cost of the spacer 10a.

Still further, since the spacer 10a is easily removed from the printed wiring board 60, it is possible to efficiently send hot air between the IC package 50 and the printed wiring board 60 to melt solder for removing the IC package 50, so that the spacer 10a will never retard removal of the IC package 50.

Furthermore, such an easy removal of the spacer 10a from the printed wiring board 60 will facilitate its recycling. Since the spacer 10a is free from solder pieces or flux, which tend to adhere thereto during its attachment or detachment, the necessity of removing or cleaning off such solder debris or flux in a recycling process is eliminated, thereby improving the efficiency of recycling.

Moreover, when the printed wiring board 60 is washed after soldering the IC package 50 thereon, the spacer 10a is easily detached therefrom before the washing, so that cleaning fluid can reach every part of the gap between the IC package 50 and the printed wiring board 60, thereby ensuring proper washing of the printed wiring board 60. In addition, such cleaning fluid having entered into the gap between the IC package 50 and the printed wiring board 60 can be easily drained, thereby improving the efficiency of washing the printed wiring board 60.

Further, the spacer body 1a has a frame-like shape whose inner outline is similar in shape to and smaller in size than the outer shape of the package body 51 of the IC package 50, and the inner outline portion is formed thinner than the gap between the IC package 50 and the printed wiring board 60, so that the spacer 10a can be securely fit into the gap.

Still further, the spacer 10a has one or more slits 2 formed thereon, extending from the inner outline (window part 4) toward the outer outline of the spacer body 1a. This arrangement allows the spacer 10a to easily change its shape when it is fixed into the gap between the IC package 50 and the printed wiring board 60 so as to enclose the package body 51 of IC package 50 whose outer shape is larger than the inner outline of the spacer 10a.

At the ends of the slits 2, there are formed holes 3 to prevent damage to the spacer body 1a by stress concentrated at the end portions of the slits 2. In addition, since these round holes 3 also function as jig holes into which a removal jig 80 is to be inserted to detach the spacer 10a from the IC package 50 and the printed wiring board 60, it is possible to easily detach the spacer 10a from the printed wiring board 60, thereby increasing convenience.

(B) Second Embodiment

Figure 5:
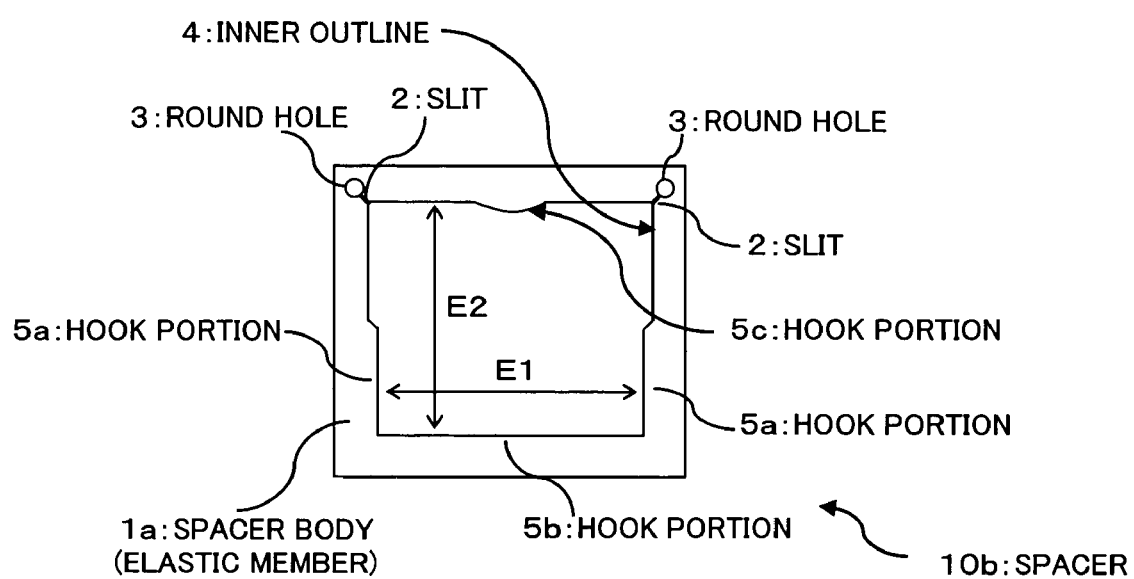
FIG. 5 is a block diagram schematically showing a construction of a spacer according to a second embodiment of the present invention.
Figure 6A:
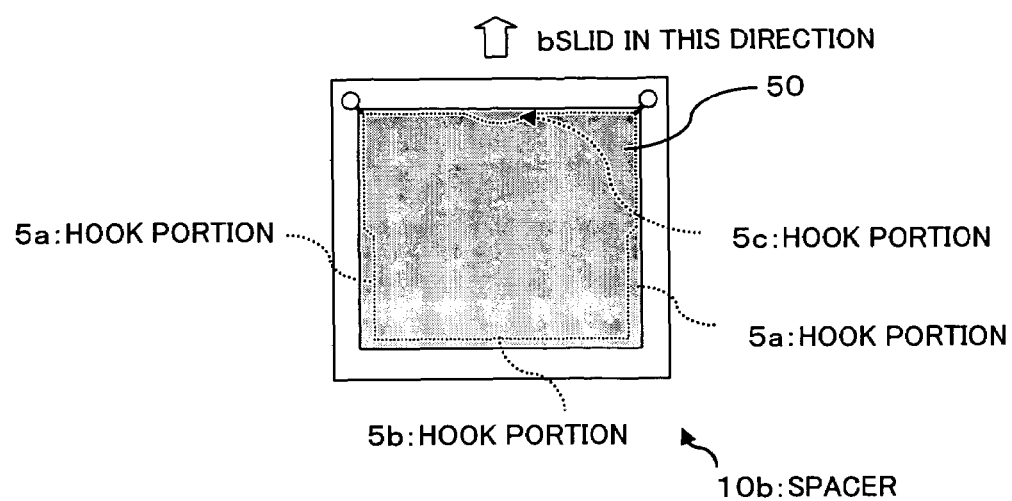
FIG. 6(a) and FIG. 6(b) are views for describing how to attach the spacer of the second embodiment onto a printed wiring board.
Figure 6B:
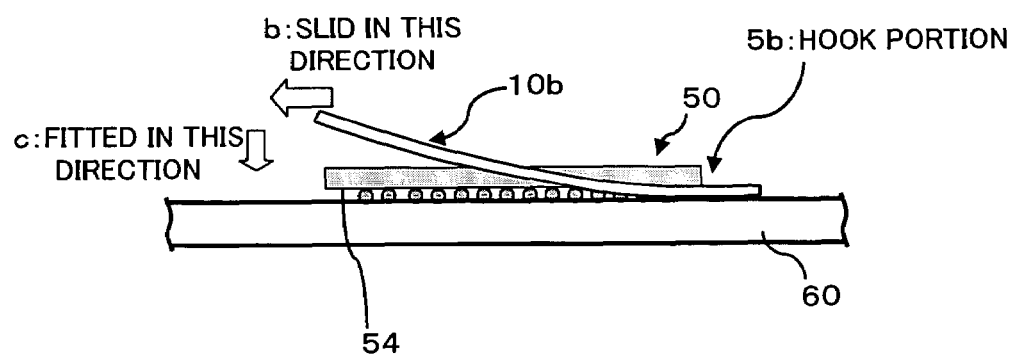

FIG. 5 depicts a spacer according to a second preferred embodiment of the present invention. FIG. 6(a) and FIG. 6(b) are views for describing how to attach the spacer to a printed wiring board 60. FIG. 6(a) and FIG. 6(b) are a plan view and a side view, respectively, illustrating an attachment process of the spacer. Like reference numbers and characters designate similar parts or elements throughout several views of the present embodiment and the conventional art, so their detailed description is omitted here.

The spacer 10b of the second embodiment has two slits 2 and two round holes 3, similar to those of the spacer 10a of the first embodiment, on two of its corners, and the two remaining corners adjacent to each other have neither such slits nor round holes formed thereon. Along one side, which lies between the two remaining corners, of the window part (inner outline) 4 of the spacer 10b, there is formed a hook portion 5b extending from end to end of the side, so as to project into the gap between the IC package 50 and the printed wiring board 60.

In addition, on another side of the window part 4, which is opposite the aforementioned side along which is formed the hook portion 5b (that is, on the side lying between the two adjacent corners on which are formed the slits 2 and the round holes 3), there is provided another hook portion 5c for projecting into the gap between the IC package 50 and the printed wiring board 60. This hook portion 5c is arranged at the middle of the side as an arch-shaped projecting portion of the window part (inner outline) 4.

In addition, a hook portion 5a for projecting into the gap between the IC package 50 and the printed wiring board 60 is formed on each of the two remaining sides of the spacer 10b. Each of the two sides is adjacent to the aforementioned side with the hook portion 5b formed thereon, with a corner portion bridging therebetween on which neither slits nor round holes are formed.

One end of each hook portion 5a is united with the hook portion 5b to form an integrated hook portion in combination. The other end of the hook portion 5a is so shaped as to become increasingly smaller in width toward the side on which formed is the hook portion 5c (in such a manner that the width of the window part 4 is gradually increased), and such hook portions 5a do not extend along entire lengths of the sides of the window part 4 but they just extend to certain lengths (in FIG. 5, almost to the middle).

In the spacer 10b of the second embodiment, as shown in FIG. 5, dimension E1 between the opposed hook portions, 5a and 5a, satisfies a condition of E1>C1, and dimension E2 between the inner edge of the hook portion 5b and the inner edge of the hook portion 5c satisfies a condition of E2>C2, where B1, B2, C1, C2 are dimensions of the IC package 50 indicated in FIG. 2(b). Further, as in the case of the spacer 10a of the first embodiment, the window part 4 of the spacer 10b is also given a size such that, even if the spacer 10b shifts at maximum after being attached to the IC package 50 and the printed wiring board 60, the window part 4 of the spacer body 1a never becomes visible from underneath the IC package 50 (its outermost outline).

Like the spacer 10a of the first embodiment, the spacer body 1b of the spacer 10b is preferably made from an elastic material with insulation, for example, a polycarbonate resin sheet such as sunloid ecosheet POLICA (SUNLOID PC ECO-SHEET INSULATION FILM; a registered trademark of Tsutsunaka Plastic Industry Co., Ltd.). Further, the spacer body 1b is formed thinner than the gap formed between the IC package 50 and the printed wiring board 60, and the difference between the thickness of the spacer body 1b and the height of the gap formed between the IC package 50 and the printed wiring board 60 is smaller than probable foreign objects to be prevented from entering the gap.

Referring now to FIG. 6(a) and FIG. 6(b), a description is made hereinbelow on how to attach such a spacer 10b of the second embodiment onto a printed wiring board 60 with an IC package 50 mounted thereon.

When the spacer 10b is attached onto the printed wiring board 60 on which an IC package 50 has been mounted, the tips (the end portions facing the hook portion 5c) of the hook portions, 5a and 5a, are inserted into the gaps, between the IC package 50 and the printed wiring board 60, formed under specific two sides of the IC package 50 opposite each other.

After that, the spacer body 1b is deformed, by exploiting its elasticity, in such a manner that the side on which the hook portion 5c (hereinafter called the hook portion 5c side) is formed is raised up (see FIG. 6(b)). While keeping the spacer body 1b deformed in such a way, the spacer 10b is slid toward the hook portion 5c side (in the slide direction; in the direction denoted by arrow b in FIG. 6(a) and FIG. 6(b)), with the hook portions 5a, 5a being fitted into the gap between the IC package 50 and the printed wiring board 60.

When the hook portion 5b is inserted into the gap, between the IC package 50 and the printed wiring board 60, formed under another side of the IC package 50, the hook portion 5c side of the spacer body 1b is pressed against the printed wiring board 60 (in the fitting direction; in the direction denoted by arrow c in FIG. 6(b)) to fit the hook portion 5c into the gap, between the printed wiring board 60 and the IC package 50, formed under the side opposite to the side under which the hook portion 5b has been fitted into.

For detaching the spacer 10b, the above attachment process is performed in inverse order. More specifically, the hook portion 5c of the spacer 10b is raised in the opposite direction to the aforementioned direction (the direction indicated by arrow c in FIG. 6(b)) to be detached from the gap between the IC package 50 and the printed wiring board 60, and then, the spacer 10b is slid in the opposite direction to the foregoing slide direction (the direction indicated by arrow b in FIG. 6(a)

and FIG. 6(b)) to detach the hook portions 5a, 5a, and 5b from the gap between the IC package 50 and the printed wiring board 60.

Here, as in the case of the spacer 10a of the first embodiment, at detachment of the spacer 10b, a removal jig with a fine point can be inserted into a round hole 3 to raise the hook portion 5c, so that the spacer 10b is removed from the printed wiring board 60 with ease.

In this manner, like effects and benefits to those of the first embodiment will be realized by the spacer 10b of the second embodiment.

(C) Third Embodiment

Figure 7:
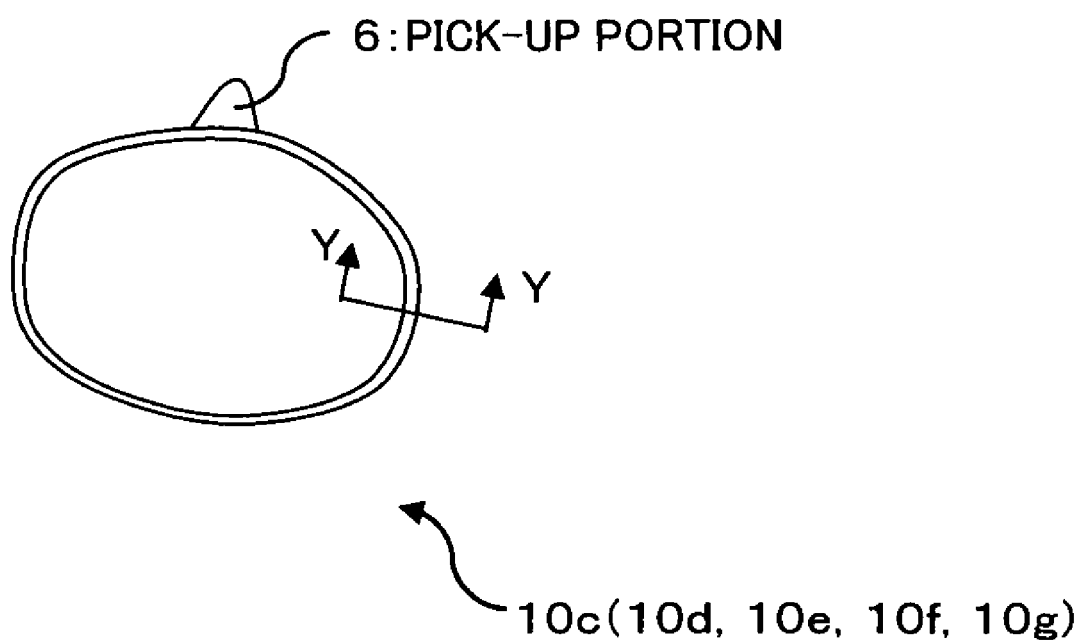
FIG. 7 is a plan view schematically showing a construction of a spacer according to a third embodiment of the present invention.
Figure 8A:
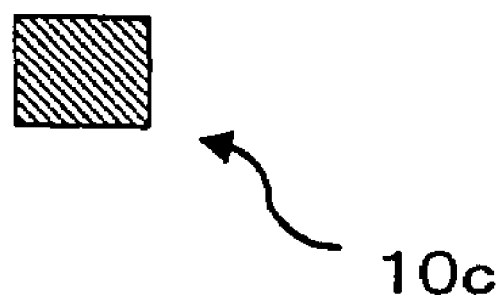
FIG. 8(a) and FIG. 8(b) are views illustrating a cross-sectional shape of the spacer of the third embodiment.
Figure 8B:
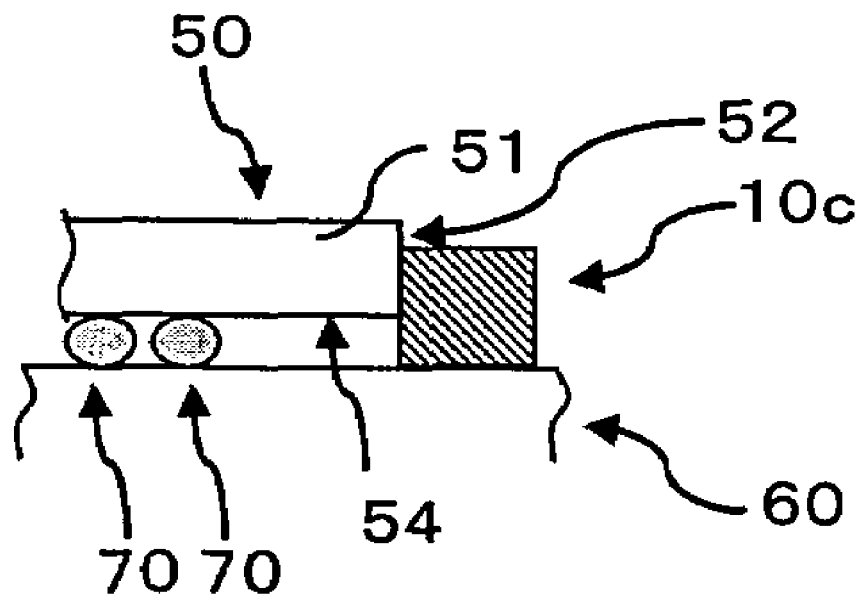

FIG. 7 is a plan view schematically showing a spacer according to a third preferred embodiment of the present invention, and FIG. 8(a) and FIG. 8(b) are its cross sectional views. FIG. 8(a) shows a cross section of the spacer (cross section Y-Y of FIG. 7); FIG. 8(b) illustrates the spacer attached to the printed wiring board 60. Like reference numbers and characters designate similar parts or elements throughout several views of the present embodiment and the conventional art, so their detailed description is omitted here.

As shown in FIG. 7, a spacer 10c of the third embodiment is made of an elastic member with no ends thereof (ring-shaped), and it has a rectangular cross-sectional shape as shown in FIG. 8(a) and FIG. 8(b). This spacer 10c is so formed as to have a perimeter length shorter than the outline of the IC package (electronic component) 50 to which the spacer 10c is to be attached, and thus, when the spacer 10c is attached to enclose the sides of the package body 51 of the IC package 50, it is pressed around the package body 51 by elastic deformation of the spacer 10c, as shown in FIG. 8(b).

The spacer 10c needs to be made from material resistant to deterioration in order to prevent its negative effects on functions and uses of the printed wiring board 60, the IC package 50, and their relative components (not shown). For instance, various types of rubber such as natural rubber and synthetic rubber (for example, petroleum synthetic rubber, silicon rubber, or fluorinated rubber) can be used to make the spacer 10c. Alternatively, some other insulating material than rubber can also be used as a material for the spacer 10c of the third embodiment, as far as the material, when given a length shorter than the outline of the IC package 50, is high enough in elasticity to be stretched, without plastic deformation, to the length required at its attachment to the IC package 50.

Further, as shown in FIG. 7, the spacer 10c has a pick-up portion 6 formed as a united part thereof. A user holds the pick-up portion 6 at attaching/detaching the spacer 10c to/from the gap between the IC package 50 and the printed wiring board 60.

The thus-formed spacer 10c of the third embodiment is stretched, by exploiting its elasticity, to a length larger than the outer shape of the package body 51 of the IC package 50. After that, as shown in FIG. 8(b), the spacer 10c is put around the sides 52 of the package body 51, while being in contact with the sides 52 of the package body 51 and the surface of the printed wiring board 60, and then the stretched spacer 10c is turned back into an original state, thereby being attached to the printed wiring board 60.

In this manner, as viewed in cross section, as illustrated in FIG. 8(b), while one of its sides is in contact with the printed wiring board 60, the spacer 10c is attached to enclose the sides 52 of the package body 51 of the IC package 50 in such a manner that another side of the spacer 10c comes into close contact with the sides 52 of the package body 51, thereby sealing the gap between the IC package 50 and the printed wiring board 60.

When detaching the spacer 10c from the printed wiring board 60, the spacer 10c is stretched once again. While it is being stretched, the spacer 10c is removed from the package body 51. At this time, a user can hold the pick-up portion 6 to easily pull the spacer 10c off the printed wiring board 60. In addition, a removal jig (not shown) with a fine point can be inserted between the spacer 10c and the IC package 50 or between the spacer 10c and the printed wiring board 60, thereby facilitating the removal of the spacer 10c.

Like effects and benefits to those of the spacer 10a of the first embodiment will be realized by the spacer 10c of the third embodiment. More precisely, since the spacer 10c of the third embodiment is attached to the printed wiring board 60 in such a manner that it encloses the IC package 50 so as to seal the gap formed between the IC package 50 and the printed wiring board 60, it is possible to prevent foreign objects entering the gap, so that failures, such as insufficient insulation, caused by such foreign objects can also be prevented.

Further, since the spacer 10c is made of an elastic member with no ends thereof (ring-shaped), it is possible to detachably attach the spacer 10c onto the printed wiring board 60 on which is fixed an IC package 50, by exploiting elastic deformation of the spacer 10c. As a result, when soldering the IC package 50 onto the printed wiring board 60, and also when removing the IC package 50 from the printed wiring board 60, the spacer 10c can be separated therefrom in advance, so that it need not be manufactured from a material which is resistant to heat caused by soldering, the manufacturing cost of the spacer 10c being thereby reduced.

Still further, the spacer 10c is easily removed from the printed wiring board 60, and thus, when hot air is blown to melt solder to remove the IC package 50, it is possible to efficiently send hot air between the IC package 50 and the printed wiring board 60, so that the spacer 10c will never retard the removal of the IC package 50.

Furthermore, such easy removal of the spacer 10c from the printed wiring board 60 will facilitate its recycling, thereby improving cost performance. In addition, cleaning of the printed wiring board 60 can also be efficiently performed.

Moreover, since the spacer 10c has a pick-up portion 6 formed as a united part thereof, a user can hold the pick-up portion 6 at attaching/detaching the spacer 10c to/from the gap between the IC package 50 and the printed wiring board 60, the attachment and detachment processes being thereby facilitated.

(D) First Modification to the Third Embodiment

Figure 9A:
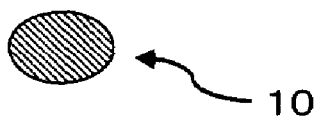
FIG. 9(a), FIG. 9(b), and FIG. 9(c) are views illustrating a spacer according to a first modification to the third embodiment.
Figure 9B:
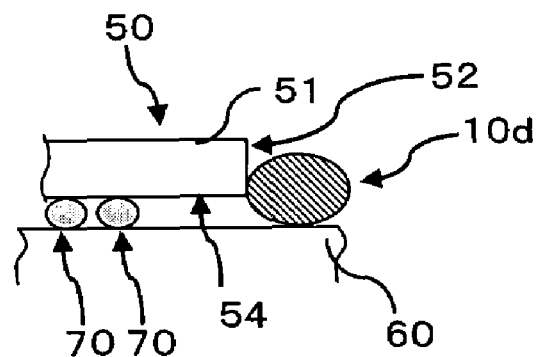
Figure 9C:
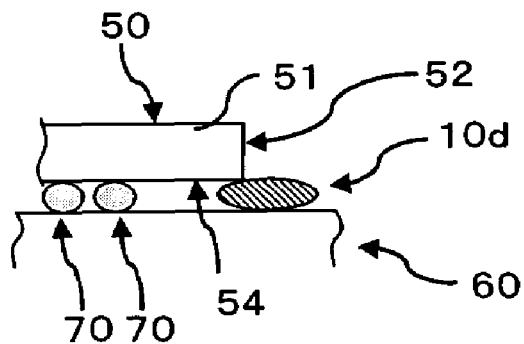

FIG. 9(a), FIG. 9(b), and FIG. 9(c) are views for describing a spacer according to a first modification of the third embodiment. FIG. 9(a) illustrates a cross section (cross section Y-Y of FIG. 7) of the spacer; FIG. 9(b) and FIG. 9(c) are partial cross-sectional views showing the spacer attached to the printed wiring board 60.

As shown in FIG. 9(a), a spacer 10d of the first modification has an oval cross section, instead of a rectangular one of the spacer 10c of the third embodiment, and other parts of the spacer 10d are similar to those of the spacer 10c of the third embodiment. Like reference numbers and characters designate similar parts or elements throughout several views of the present embodiment and the conventional art, so their detailed description is omitted here.

According to the first modification, as shown in FIG. 9(b), while in contact with the printed wiring board 60, the spacer 10d is attached to enclose the sides 52 of the package body 51 of the IC package 50 in such a manner that its inner outline portion with a round cross section comes in close contact with the sides 52 of the package body 51, thereby sealing the gap between the IC package 50 and the printed wiring board 60.

With this arrangement, like effects and benefits to those of the spacer 10c of the third embodiment will be realized by the spacer 10d of the first modification.

In addition, if the spacer 10d is so formed as to have a height (thickness) slightly larger than the height of the gap formed between the IC package 50 and the printed wiring board 60, part (a projecting portion) of the spacer 10d, at its attachment into the gap, resultantly projects into the gap, so that the spacer 10d is securely attached to the printed wiring board 60.

(E) Second Modification to the Third Embodiment

Figure 10A:
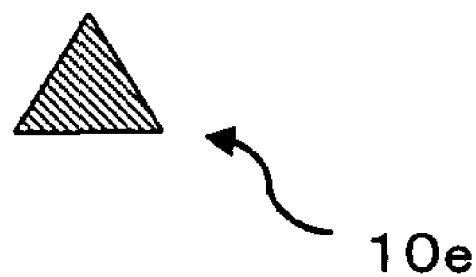
FIG. 10(a) and FIG. 10(b) are views illustrating a spacer according to a second modification to the third embodiment.
Figure 10B:
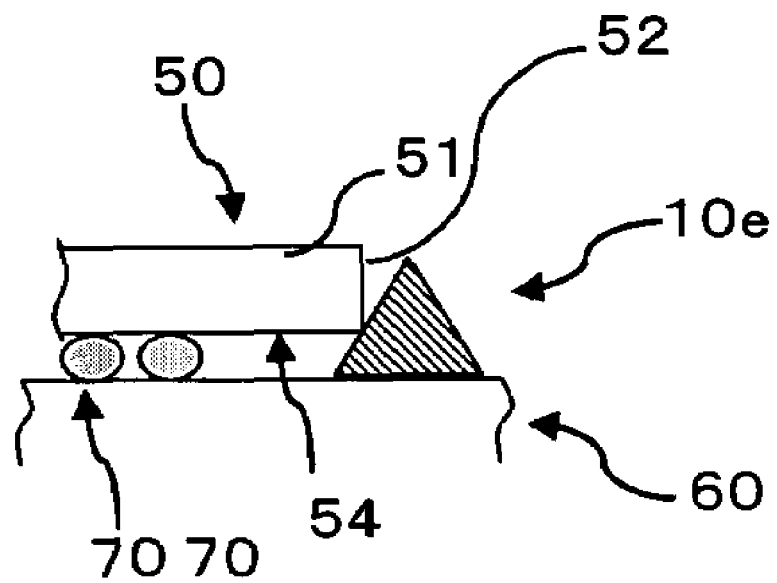

FIG. 10(a) and FIG. 10(b) are views for describing a spacer according to a second modification of the third embodiment. FIG. 10(a) illustrates a cross section (cross section Y-Y of FIG. 7) of the spacer; FIG. 10(b) is a partial cross-sectional view showing the spacer attached to the printed wiring board 60.

As shown in FIG. 10(a), a spacer 10e of the second modification has a triangle cross section, instead of a rectangular one of the spacer 10c of the third embodiment, and other parts of the spacer 10e are similar to those of the spacer 10c of the third embodiment. Like reference numbers and characters designate similar parts or elements throughout several views of the present embodiment and the conventional art, so their detailed description is omitted here.

According to the second modification, as shown in FIG. 10(b), while it is in contact with the printed wiring board 60, the spacer 10e is attached to enclose the sides 52 of the package body 51 of the IC package 50 in such a manner that one of the surfaces of the spacer 10e (the inner outline portion of the spacer 10e) comes in close contact with the sides 52 (edges) of the package body 51, thereby sealing the gap between the IC package 50 and the printed wiring board 60.

With this arrangement, like effects and benefits to those of the spacer 10c of the third embodiment will be realized by the spacer 10e of the second modification.

In addition, when the spacer 10e is fitted into the gap between the IC package 50 and the printed wiring board 60, one corner (projecting portion) of the triangle, as viewed in cross section, projects into the gap in such a way as is shown in FIG. 10(b), so that the spacer 10e is securely attached on the printed wiring board 60.

(F) Third Modification to the Third Embodiment

Figure 11A:
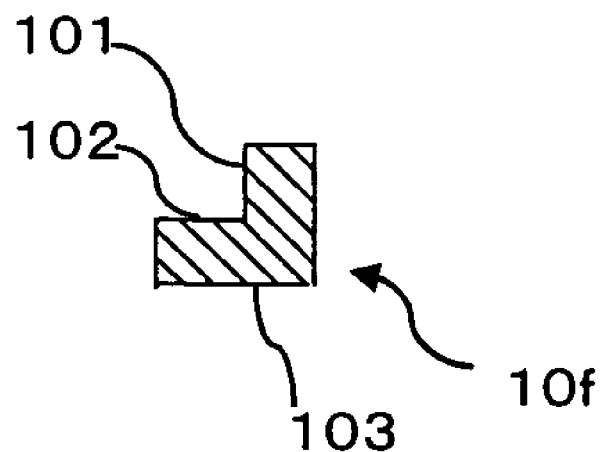
FIG. 11(a) and FIG. 11(b) are views illustrating a spacer according to a third modification to the third embodiment.
Figure 11B:
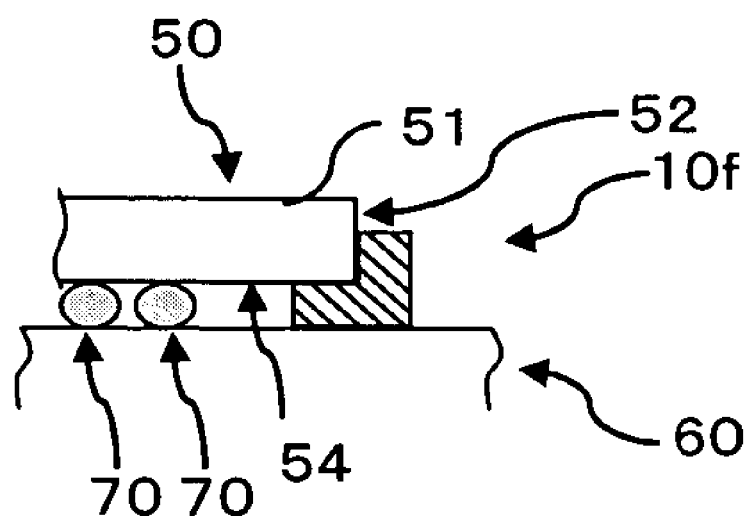

FIG. 11(a) and FIG. 11(b) are views for describing a spacer according to a third modification of the third embodiment. FIG. 11(a) illustrates across section (cross section Y-Y of FIG. 7) of the spacer; FIG. 11(b) is a partial cross-sectional view showing the spacer attached to the printed wiring board 60.

As shown in FIG. 11(a), a spacer 10f of the third modification has an L-shaped cross section, instead of a rectangular one of the spacer 10c of the third embodiment, and other parts of the spacer 10f are similar to those of the spacer 10c of the third embodiment. Like reference numbers and characters designate similar parts or elements throughout several views of the present embodiment and the conventional art, so their detailed description is omitted here.

As shown in FIG. 11(a) and FIG. 11(b), the L-shaped cross section of the spacer 10f has: a package-side contact surface 101 which comes in contact with the sides 52 of the package body 51 of the IC package 50; a package-undersurface contact surface 102 which comes in contact with the undersurface 54 of the package body 51; and a printed wiring board contact surface 103 which comes in contact with the surface of the printed wiring board 60. While the printed wiring board contact surface 103 is in contact with the printed wiring board 60, the package-side contact surface 101 comes in contact with the sides 52 of the package body 51 of the IC package 50, and at the same time, while the package-undersurface contact surface 102 is in contact with the undersurface 54 of the package body 51, the spacer 10e is attached to enclose the sides 52 of the package body 51.

As a result, the package-side contact surface 101 of the spacer 10f comes in close contact with the sides 52 of the package body 51, and also, the printed wiring board contact surface 103 comes in close contact with the surface of the printed wiring board 60, so that the spacer 10f encloses the IC package 50 to seal the gap between the IC package 50 and the printed wiring board 60.

That is, like effects and benefits to those of the spacer 10c of the third embodiment will be realized by the spacer 10f of the third modification.

In addition, when the spacer 10f is fitted into the gap between the IC package 50 and the printed wiring board 60, as shown in FIG. 11(b), a portion (projecting portion) of the spacer 10f, which portion, as viewed in the cross section of the spacer 10f, is sandwiched between the package-undersurface contact surface 102 and the printed wiring board contact surface 103, projects into the gap between the IC package 50 and the printed wiring board 60, thereby securing attachment of the spacer 10f on the printed wiring board 60.

The spacer 10f of the third modification of the third embodiment has the package-side contact surface 101 and the package-undersurface contact surface 102 formed at a right angle so that they come in close contact with the side and the undersurface, respectively, of the package body 51. However, the present invention should by no means be limited to this, and various changes or modifications can be suggested without departing from the gist of the invention. One example of such modifications will be described herein below as a fourth modification of the third embodiment.

(G) Fourth Modification to the Third Embodiment

Figure 12A:
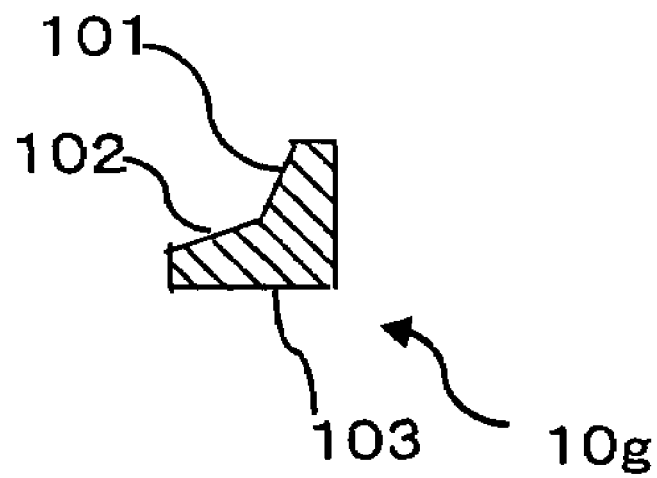
FIG. 12(a) and FIG. 12(b) are views illustrating a spacer according to a fourth modification to the third embodiment.
Figure 12B:
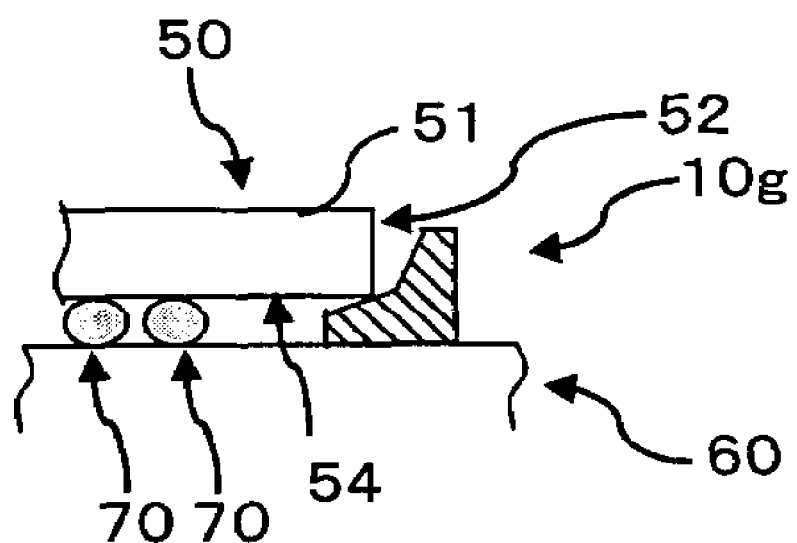

FIG. 12(a) and FIG. 12(b) are views for describing a spacer according to a fourth modification of the third embodiment. FIG. 12(a) illustrates across section (cross section Y-Y of FIG. 7) of the spacer; FIG. 12(b) is a partial cross-sectional view showing the spacer attached on the printed wiring board 60. Like reference numbers and characters designate similar parts or elements throughout several views of the present embodiment and the conventional art, so their detailed description is omitted here.

As shown in FIG. 12(a) and FIG. 12(b), a spacer 10g has the package-side contact surface 101 and the package-undersurface contact surface 102 formed at an angle greater than 90° so that the bottom (an edge of the undersurface 54) of the sides 52 of the package body 51 comes in contact with either the package-side contact surface 101 or the package-undersurface contact surface 102 (the package-undersurface contact surface 102 in FIG. 12(b)).

With this construction, the package-side contact surface 101 or the package-undersurface contact surface 102 of the spacer 10g comes in contact with the sides (or the undersurface 54) of the package body 51, while the printed wiring board contact surface 103 comes in contact with the surface of the printed wiring board 60, so that the spacer 10g encloses the IC package 50 to seal the gap between the IC package 50 and the printed wiring board 60.

(H) Fourth Embodiment

Figure 13:
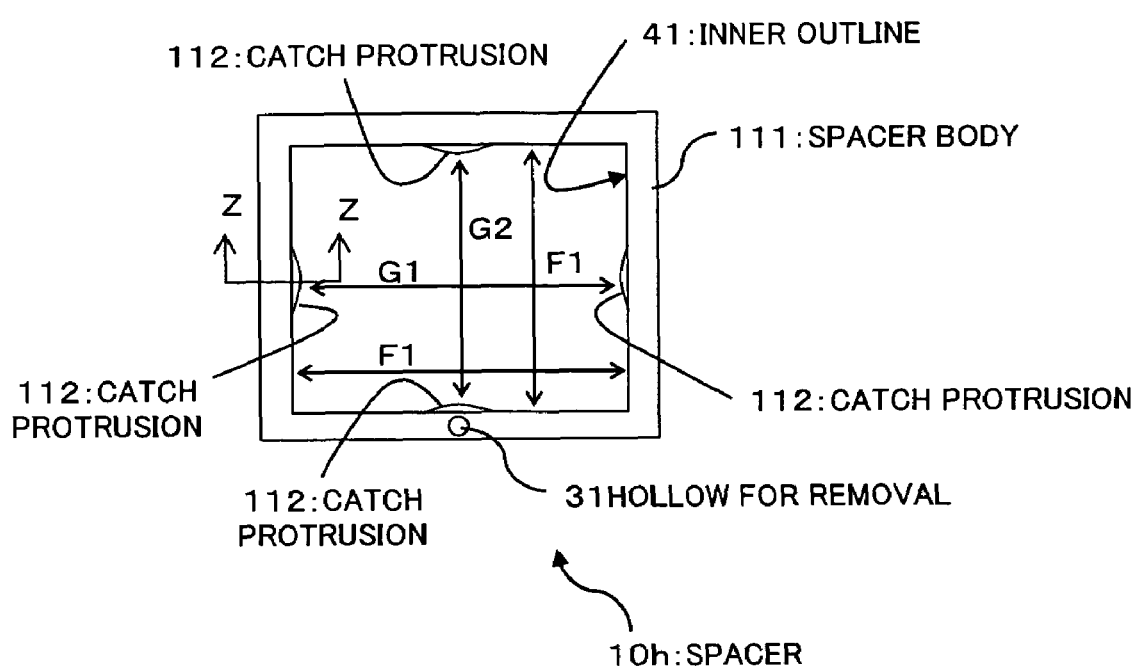
FIG. 13 is a view for describing a construction of a spacer according to a fourth embodiment of the present invention.
Figure 14A:
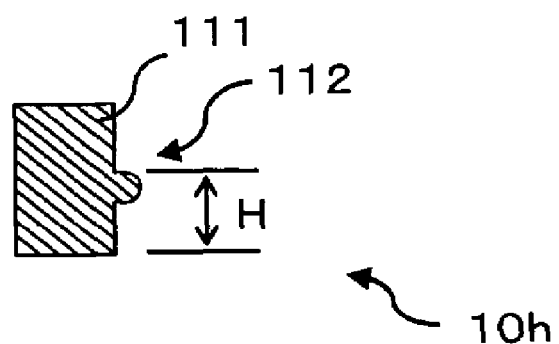
FIG. 14(a) and FIG. 14(b) are cross-sectional views for describing the spacer according to the fourth embodiment of the present invention.
Figure 14B:
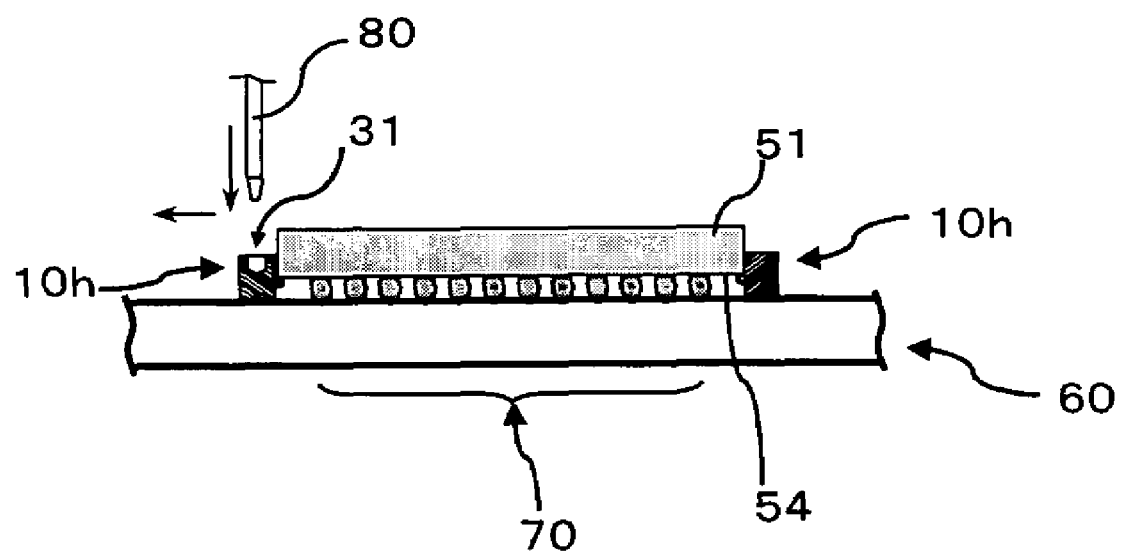

FIG. 13 is a view for describing a spacer according to a fourth preferred embodiment of the present invention. FIG. 14(a) illustrates a cross section of the spacer; FIG. 14(b) shows a cross section taken along line Z-Z of FIG. 13, and it illustrates the spacer attached on the printed wiring board 60. Like reference numbers and characters designate similar parts or elements throughout several views of the present embodiment and the conventional art, so their detailed description is omitted here.

The spacer 10h of the fourth embodiment has a spacer body 111 made of an elastic member with insulation. As shown in FIG. 13, the elastic member is formed into a frame-like shape (with no ends thereof) at the center of which is opened a window part 41, which is for fitting the elastic member around an IC package (electronic component) 50 (see FIG. 2(b)).

The outline of the window part 41, which forms the inner outline of a spacer body 1a, is similar in figure to the outer shape of the IC package 50 to which the spacer body 10h is to be attached. As in the first embodiment, the following description will be made to an example where the IC package 50 has a rectangular shape, the window part 41 also has a rectangular figure in the fourth embodiment.

At almost the center of each side of the inner outline (window part 41), there is formed a catch protrusion 112 for projecting into the gap between the IC package 50 and the printed wiring board 60.

Two or more of such catch protrusions 112 are formed at different positions along the inner outline of the spacer body 111. Here, in an example of FIG. 13, four catch protrusions 112 are arranged, one on each side of the window part 41 of the spacer body 111. However, provided that only two catch protrusions 112 are formed, they should be formed on any two sides, opposite or adjacent to each other, of the spacer body.

The size of the window part 41 is similar to or slightly smaller than that of the outer shape of the package body 51 of the IC package 50 to which the spacer body 10h is to be attached. That is, as shown in FIG. 2(b), the spacer body 10h satisfies conditions of F1≦B1, F2≦B2, and also conditions of F1>C1, F2>C2, where the size of the outer shape of the package body 51 of the IC package 50 is expressed as B1×B2 (horizontal×vertical); the size of an area with corners pointed by four package terminals 53 that are placed closest to the respective edges of the undersurface 54 of the package body 51, is given by C1×C2 (horizontal×vertical); and the size of the window part 4 of the spacer 10a is expressed as F1×F2 (horizontal×vertical).

The spacer body 10h is pressed around the package body 51 by elastic deformation of the spacer body 111.

In addition, the height H (see FIG. 14(a)), from the bottom of the spacer body 111 to the upper surface of the catch protrusions 112, is so formed as to be approximately the same as the height of the gap between the IC package 50 and the printed wiring board 60.

Further, as shown in FIG. 13, on the surface of the spacer body 111 there is formed at least one removal hollow 31 big enough to insert the tip of a jig 80 thereinto. A removal jig 80 (see FIG. 14(b)) is inserted into the removal hollow 31 to enlarge the spacer body 111 (window part 41) at detachment of the spacer body 10h. Here, it is preferred that the removal hollow 31 is arranged on the surface of the spacer body 111 at a position close to the catch protrusions 112.

The spacer 10c is preferably made from elastic material with insulation, for example, various types of rubber such as natural rubber and synthetic rubber (for example, petroleum synthetic rubber, silicon rubber, or fluorinate rubber). Alternatively, some other insulating material than rubber can also be used as a material for the spacer 10h of the fourth embodiment, as far as the material, while it is attached around the IC package 50, is high enough in elasticity to be stretched, without plastic deformation, to a position where it becomes possible to pull at least one of the catch protrusions 112 out of the gap between the IC package 50 and the printed wiring board 60.

When such a spacer 10h of the fourth embodiment is attached onto a printed wiring board 60 on which an IC package 50 has been attached, the spacer 10h is stretched to become bigger than the outer shape of the package body 51 of the IC package 50, by exploiting elasticity of the spacer 10h, to enclose the package body 51, and then the stretched spacer 10h is turned back into an original state, thereby being attached onto the printed wiring board 60.

At that time, as shown in FIG. 14(b), the undersurface of the spacer 10h is made to contact with the surface of the printed wiring board 60, and at the same time, the catch protrusions 112 are inserted into the gap between the IC package 50 and the printed wiring board 60.

In this manner, while the spacer 10h is in contact with the printed wiring board 60, the window part 41 (inner outline) of the spacer 10h is pressed around (sides 52) the IC package 50 by elastic deformation of the spacer 10h, to enclose the IC package 50 to seal the gap between the IC package 50 and the printed wiring board 60. In addition, at this time, the catch protrusions 112 are inserted into the gap between the IC package 50 and the printed wiring board 60, the spacer 10h being thereby securely attached on the printed wiring board 60.

When detaching the spacer 10h from the printed wiring board 60, the spacer 10h is stretched once again to be pulled off the package body 51. At that time, a removal jig 80 can be inserted into the removal hollow 31 to deform the spacer 10h in such a manner that a side of the spacer body 111 is separated from the IC package 50, thereby facilitating the detachment of the spacer 10h.

Like effects and benefits to those of the spacer 10c of the third embodiment will be realized also by the spacer 10h of the fourth embodiment. More precisely, since the spacer 10h of the fourth embodiment is attached onto the printed wiring board 60 in such a manner that it encloses the IC package 50 so as to seal the gap formed between the IC package 50 and the printed wiring board 60, it is possible to prevent foreign objects entering the gap, so that failures, such as insufficient insulation, caused by such foreign objects can be also prevented.

Further, since the spacer 10h is formed as an elastic member with a frame-like shape (with no ends thereof), it is possible to detachably attach the spacer 10h onto the printed wiring board 60 on which is fixed an IC package 50, by exploiting elastic deformation of the spacer 10h. As a result, when soldering the IC package 50 onto the printed wiring board 60, and also when removing the IC package 50 from the printed wiring board 60, the spacer 10h can be separated therefrom in advance, so that the spacer 10h need not be manufactured from a material which is resistant to heat caused by soldering, the manufacturing cost of the spacer 10h being thereby reduced.

Still further, the spacer 10h is easily removed from the printed wiring board 60, and thus, when hot air is blown to melt solder to remove the IC package 50, it is possible to efficiently send hot air between the IC package 50 and the printed wiring board 60, so that the spacer 10h will never retard removal of the IC package 50.

Furthermore, such an easy removal of the spacer 10h from the printed wiring board 60 will facilitate its recycling, thereby improving cost performance. In addition, cleaning of the printed wiring board 60 can also be efficiently performed.

(I) One Modification to the Fourth Embodiment

Figure 15A:
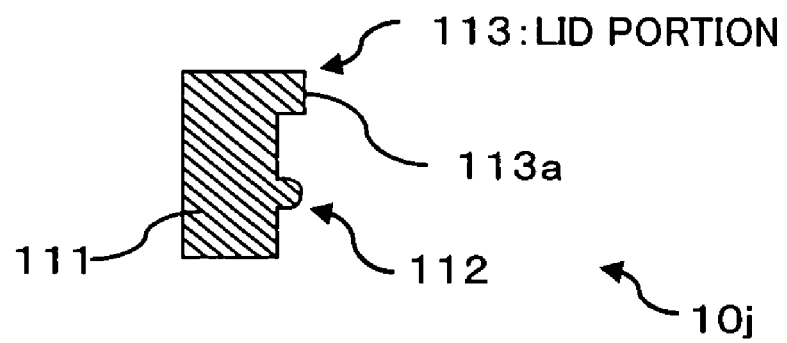
FIG. 15(a) and FIG. 15(b) are views illustrating a spacer according to one preferred modification to the fourth embodiment.
Figure 15B:
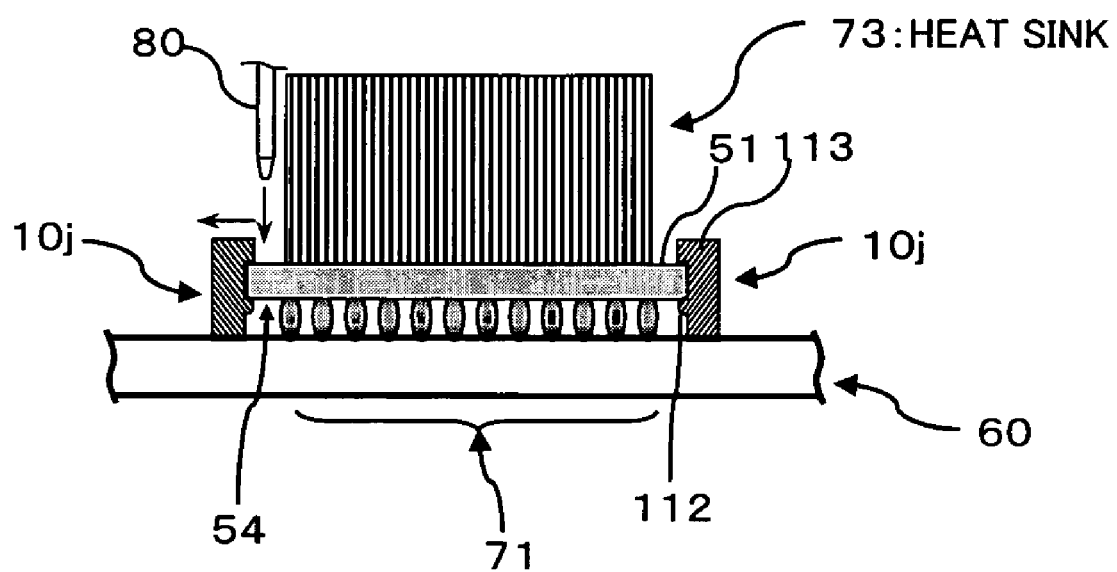

FIG. 15(a) and FIG. 15(b) are views for describing a spacer according to one modification of the fourth embodiment. FIG. 15(a) illustrates across section (cross section Z-Z of FIG. 13) of the spacer; FIG. 15(b) is a partial cross-sectional view showing the spacer attached to the printed wiring board 60.

As shown in FIG. 15(a), the spacer 10j has the spacer body 111 of the spacer 10h of the fourth embodiment with a lid portion 113 on its top to project into the window part 41. Such a lid portion 113 is provided on the upper surfaces of all the four sides of the spacer body 111. Other parts of the spacer 10j are similar to those of the spacer 10h. Here, like reference numbers and characters designate similar parts or elements throughout several views of the present embodiment and the conventional art, so their detailed description is omitted here.

In FIG. 15(b), the IC package 50, to which a heat sink 73 is attached, is electrically connected to the printed wiring board 60 via electrode pins 71 (PGA).

As in the case of the spacer 10h, as shown in FIG. 15(b), the spacer 10j is stretched larger than the outer shape of the package body 51 of the IC package 50, by exploiting elasticity of the spacer 10j, to enclose the package body 51, and then the stretched spacer 10j is turned back into an original state, thereby being attached to the printed wiring board 60.

At this time, as shown in FIG. 15(b), the undersurface of the spacer 10j is made to contact with the surface of the printed wiring board 60, and the catch protrusions 112 are inserted into the gap between the IC package 50 and the printed wiring board 60, and additionally, the lid portion 113 covers the upper edge of the package body 51 so that the package body 51 is sandwiched between the lid portion 113 and the catch protrusion 112, the spacer 10j being thereby secured around the spacer 10j.

When detaching the spacer 10j from the printed wiring board 60, a removal jig 80 is pushed against the inner wall 113a of the lid portion 113, and the spacer 10j is then stretched to pull the spacer 10j off the package body 51, thereby being easily removed from the printed wiring board 60.

Here, in this modification, also, there can be formed a removal hollow 31 on the top of the lid portion 113. A removal jig 80 with a narrow point is inserted into the removal hollow 31 to deform the spacer 10j to pull it from the package body 51, thereby facilitating the detachment of the spacer 10j.

Like effects and benefits of those of the fourth embodiment will be realized also by the spacer 10j of this modification of the fourth embodiment. In addition, when attaching the spacer 10j into the gap between the IC package 50 and the printed wiring board 60, since the spacer body 111 is sandwiched between the lid portion 113 and the catch protrusions 112, the spacer 10j is securely fixed to the printed wiring board 60, and the lid portion 113 prevents foreign objects entering the gap from above.

(J) Other Modifications

Further, the present invention should by no means be limited to the above-illustrated embodiment, but various changes or modifications may be suggested without departing from the gist of the invention.

For example, the first and the second embodiments have round holes 3 arranged at the ends of the slits 2. However, such round holes are not imperative, and all or some of the slits 2 can be omitted at manufacturing of the spacers, 10a and 10b.

Further, the foregoing first, second, and third embodiments and their modifications are applications of the present invention to a BGA (Ball Grid Array) in which the IC package 50 is electrically connected to the printed wiring board 60 via solder balls 70. However, as has been described in the fourth embodiment, the present invention is also applicable to other types of printed wiring boards 60 in which some other technique, such as PGA (Pin Grid Array), is used to connect the IC package 50 to the printed wiring board 60. Various changes or modifications may be suggested without departing from the gist of the invention.

Likewise, the fourth embodiment is an application of the present invention to PGA, and it is also applicable to PGA.

Still further, the materials of the spacers, 10a, 10b, 10c, 10d, 10e, 10f, 10g, 10h, 10j, are not limited to the materials described in the above embodiment, and various changes or modifications may be suggested without departing from the gist of the invention.

Furthermore, the IC package 50 connected to the printed wiring board 60 has a rectangular shape in the above embodiments. However, the IC package 50 can be given some other shape, and various changes or modifications may be suggested without departing from the gist of the invention. In that case, each spacer, 10a, 10b, 10h, 10j, needs to have a frame-like shape similar to the outer shape of the IC package 50.

Moreover, in the above fourth embodiment, the IC package 50 is equipped with a heat sink 73. Such a heat sink 73 can also be equipped to the IC package 50 of other embodiments and their modifications, and even if the heat sink 73 is attached to the IC package 50, it is still easy to attach and detach the spacers, 10a, 10b, 10c, 10d, 10e, 10f, 10g, 10h, 10j, to and from the IC package 50 and the printed wiring board 60.

What is claimed is:

1. A spacer for attaching onto a printed wiring board to which is fixed an electronic component having a component package, said spacer comprising a single-piece elastic member with no ends thereof,
   said elastic member being detachably attached to the printed wiring board in such a way as to enclose the electronic component to seal a gap between the electronic component and the printed wiring board, and
   said elastic member being attached to and detached from the printed wiring board, by exploiting elastic deformation of said elastic member, wherein said elastic member has a frame-like shape with an inner outline which is similar in shape to an outline of the component package, and is smaller in length than the outline of the component package, and is thinner than the gap between the electronic component and the printed wiring board.

2. A spacer as set forth in claim 1,
   wherein the frame-like shape has an outer outline greater in length than the outline of the component package, and
   wherein the frame-like shape has at least one slit thereon extending from the inner outline toward the outer outline of the frame-like shape.

3. A spacer as set forth in claim 2, wherein the frame-like shape has a round hole formed at one end of the slit.

4. A spacer as set forth in claim 3, wherein the round hole functions as a jig hole for use in removing the spacer from the electronic component and the printed wiring board.

5. A spacer for attaching onto a printed wiring board to which is fixed an electronic component having a component package, said spacer comprising an elastic member with no ends thereof,
   said elastic member being detachably attached to the printed wiring board in such a way as to enclose the electronic component to seal a gap between the electronic component and the printed wiring board, and
   said elastic member being attached to and detached from the printed wiring board by exploiting elastic deformation of said elastic member,
   wherein said elastic member has a frame-like shape with an inner outline which is similar in shape and length to an outline of the component package and is thinner than the gap between the electronic component and the printed wiring board, and
   wherein the frame-like shape has a pair of hook portions for projecting into the gap between the electronic component and the printed wiring board, the hook portions being provided on the inner outline of the frame-like shape to oppose to each other.

6. A spacer as set forth in claim 5,
   wherein the frame-like shape has an outer outline greater in length than the outline of the component package, and
   wherein the frame-like shape has at least one slit thereon extending from the inner outline toward the outer outline of the frame-like shape.

7. A spacer as set forth in claim 6, wherein the frame-like shape has a round hole formed at one end of the slit.

8. A spacer as set forth in claim 7, wherein the round hole functions as a jig hole for use in removing the spacer from the electronic component and the printed wiring board.

9. A spacer for attaching onto a printed wiring board to which is fixed an electronic component having a component package, said spacer comprising a single-piece elastic member with no ends thereof,
   said elastic member being detachably attached to the printed wiring board in such a way as to enclose the electronic component to seal a gap between the electronic component and the printed wiring board, and
   said elastic member being attached to and detached from the printed wiring board, by exploiting elastic deformation of said elastic member,
   wherein said elastic member has a frame-like shape with an inner outline which is similar in shape to an outline of the component package, and said elastic member, while in contact with the printed wiring board, is attached around the component package by pressure due to the elastic deformation of said elastic member, and
   wherein the frame-like shape has a catch protrusion on its inner outline, which catch protrusion protrudes into the gap between the electronic component and the printed wiring board.

10. A printed circuit board, comprising:
   an electronic component having a component package,
   a printed wiring board to which said electronic component is fixed; and
   a spacer formed as a single-piece elastic member with no ends thereof detachably attached to said printed wiring board in such a way as to enclose said electronic component to seal a gap between said electronic component and said printed wiring board, said elastic member being attached to and detached from said printed wiring board, by exploiting elastic deformation of the elastic member,
   wherein the elastic member has a frame-like shape with an inner outline which is similar in shape to an outline of the component package, and is smaller in length than the outline of the component package, and is thinner than the gap between the electronic component and said printed wiring board.

* * * * *